United States Patent [19]
Krimmel et al.

[11] Patent Number: 4,784,963
[45] Date of Patent: Nov. 15, 1988

[54] METHOD FOR LIGHT-INDUCED PHOTOLYTIC DEPOSITION SIMULTANEOUSLY INDEPENDENTLY CONTROLLING AT LEAST TWO DIFFERENT FREQUENCY RADIATIONS DURING THE PROCESS

[75] Inventors: Eberhard F. Krimmel, Pullach, Fed. Rep. of Germany; Adolf G. K. Lutsch, Johannesburg, South Africa

[73] Assignee: Siemens Aktiengesellschaft, Berlin and Munich, Fed. Rep. of Germany

[21] Appl. No.: 48,965

[22] Filed: May 11, 1987

Related U.S. Application Data

[63] Continuation of Ser. No. 706,155, Feb. 27, 1985, abandoned.

[30] Foreign Application Priority Data

Feb. 27, 1984 [DE] Fed. Rep. of Germany ....... 3407089

[51] Int. Cl.$^4$ .................. H01L 21/205; H01L 21/225
[52] U.S. Cl. ......................... 437/19; 148/DIG. 71; 204/157.15; 427/53.1; 427/54.1; 427/55; 427/56.1; 437/88; 437/108; 437/160; 437/173; 437/929; 437/942; 437/963
[58] Field of Search .................. 437/19, 88, 108, 160, 437/173, 942, 929, 963

[56] References Cited

U.S. PATENT DOCUMENTS

| | | | |
|---|---|---|---|
| 3,200,018 | 8/1965 | Grossman | 148/175 |
| 3,351,503 | 11/1967 | Fotland | 148/DIG. 71 |
| 3,490,961 | 1/1970 | Frieser et al. | 148/175 |
| 3,661,637 | 5/1972 | Sirtl | 148/175 X |
| 4,115,163 | 9/1978 | Gorina et al. | 148/175 |
| 4,330,570 | 5/1982 | Giuliani et al. | 427/54.1 |
| 4,340,617 | 7/1982 | Deutsch et al. | 427/53.1 |
| 4,454,835 | 6/1984 | Walsh et al. | 118/712 |
| 4,509,451 | 4/1985 | Collins et al. | 204/164 X |
| 4,524,090 | 6/1985 | Bottka et al. | 427/53.1 |

FOREIGN PATENT DOCUMENTS 2944118  5/1981  Fed. Rep. of Germany .

Primary Examiner—William G. Saba
Attorney, Agent, or Firm—Hill, Van Santen, Steadman & Simpson

[57] ABSTRACT

Semiconductor components which have a plurality of layers lying on top of one another are manufactured with the assistance of a method for light-induced, photolytic deposition. Particularly, periodically alternating layers (hyperfine structure elements) and/or doping patterns are produced simultaneously with deposition of layers and/or with randomly selected doping gradients. In particular, the method is also suited for simultaneous deposition of layers lying laterally side-by-side or of laterally side-by-side differing dopings of a layer being deposited. In the context of doping, the radiation damage known from implantation is avoided.

9 Claims, 2 Drawing Sheets

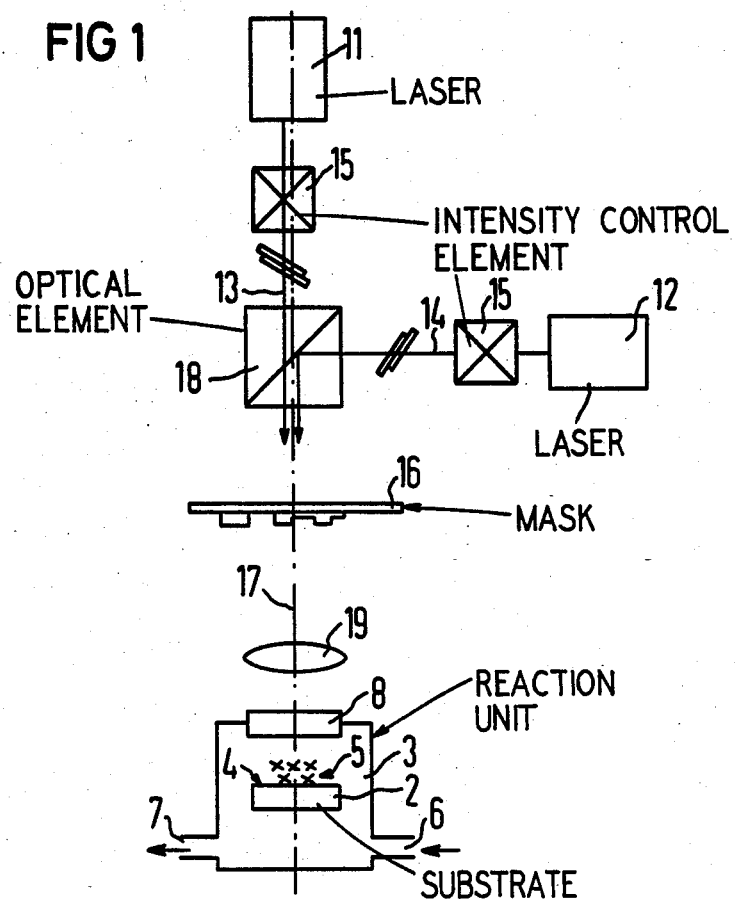
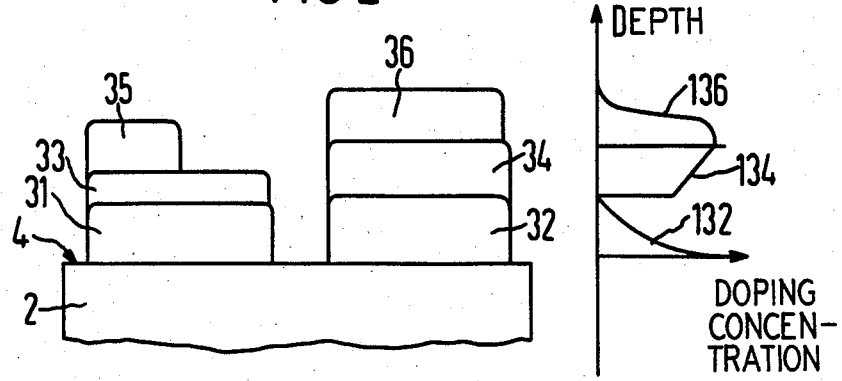

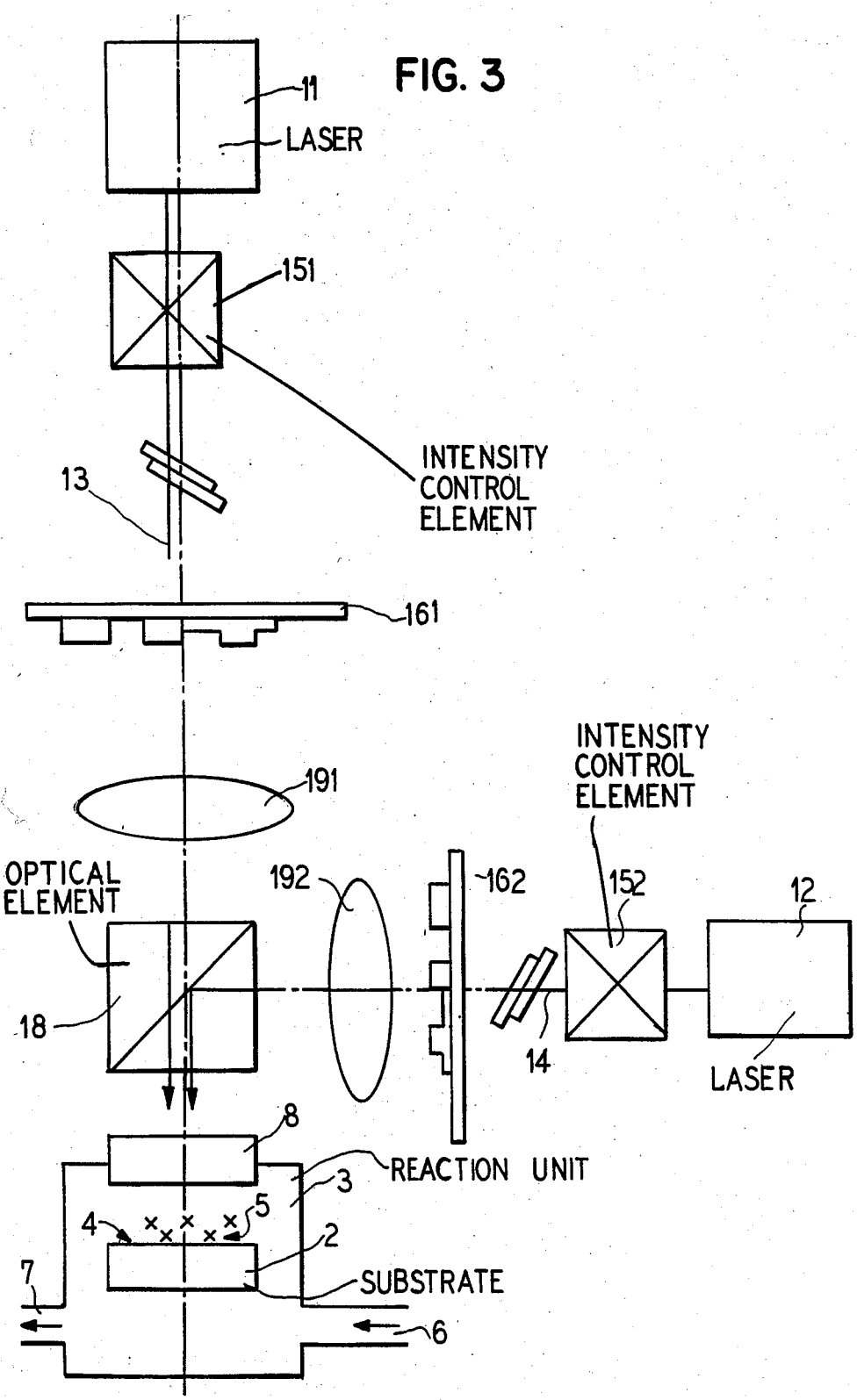

METHOD FOR LIGHT-INDUCED PHOTOLYTIC DEPOSITION SIMULTANEOUSLY INDEPENDENTLY CONTROLLING AT LEAST TWO DIFFERENT FREQUENCY RADIATIONS DURING THE PROCESS

This is a continuation of application Ser. No. 706,155 filed Feb. 27, 1985, now abandoned.

BACKGROUND OF THE INVENTION

The present invention relates to a method and apparatus for light-induced photolytic deposition or doping of layers or substrates wherein deposition or doping materials are in contact in either liquid or gaseous form with a surface of the layer or substrate, and wherein radiation to be employed for photolysis is directed to the surface.

It is known to deposit thin layers or a layer sequence of identical material or of different materials on a substrate of identical or different material. Most widespread for this purpose is thermal evaporation techniques. Also known however, is deposition according to a plasma process and molecular beam epitaxy by use of various sources for the materials, or of one source having a material composition prescribed by the layers to be produced. It is not a problem per se to produce the layers, particularly extremely thin layers such as which cover a respective surface on which such a respective layer is deposited and distributed is largely uniform manner. But considerable difficulties arise when prescribed concentration ratios and/or concentration gradients of various constituents of the layer are required, namely in a direction perpendicular to the surface and/or in an arbitrary lateral direction of the corresponding layer.

SUMMARY OF THE INVENTION

An object of the present invention is to specify a simple and particularly reliable method by which doped or undoped layers can be deposited and/or a substrate and/or a deposited layer can be provided with a doping. The deposited layer and/or the doping is to have prescribed values of the concentration of the deposition material and/or of the doping in a perpendicular direction and/or in arbitrarily prescribed lateral directions. Thus, included is the concentration value "0", for example, a deposited layer provided with lateral structure and/or a layer with doped and undoped layer regions adjacent to one another in a perpendicular direction and/or lateral direction.

This object is achieved by providing a photolitic process wherein the layer or substrate is controllably and optionally deposited or doped with at least two different materials during the process. At least two different frequency radiations are employed during the process. Respective intensities of each of the two radiations are independently controlled in accordance with the desired processing for integrated deposition or doping. At least two different materials present with one another during the process are mixed. According to the invention, at least one of the radiations is stopped at least once during the processing.

The method of the invention makes use of the known principle of photolytic deposition, as well as light-induced catalytic deposition under given conditions. For the purpose of depositing a layer, the substrate on whose surface the layer is to be deposited is brought into contact with the material provided for the respective deposition, preferably material present in gaseous form. Correspondingly selected light is then allowed to influence this material and/or the surface of the substrate. This light irradiation leads to a photolytic process which causes the growth of material on a surface and/or leads to doping processes. This process with deposition and/or doping is executed where this corresponding light reaches. When a mask is employed which causes a lateral structuring of the intensity of the incident light on the corresponding structure, then a correspondingly locally prescribable deposition and/or doping results. Since the incident light intensity can be controlled or modulated during the chronological sequence of the deposition by known techniques, the time-wise growth process or doping execution can be thus correspondingly varied. The two instances thus lead to concentration differences of the deposition and/or doping which occur in lateral or in normal directions.

With the invention, however, a very specific type of deposition or doping can be executed, this being referred to as integrated deposition or integrated doping. At least two different materials are simultaneously deposited as a layer and/or are deposited as layers in immediate chronological succession to one another and/or cause correspondingly different dopings. Included in this concept is to deposit a single layer and, simultaneously during this deposition, to generate one or more different dopings that are homogeneously distributed or inhomogeneously distributed at the same time as the deposition. Also inclusive in this process is to deposit two or more layers on top of one another, and particularly to generate periodically alternating sequences of prescribed layers. For example, semiconductor hyperstructures and/or semiconductor band modellings can thus be generated in a simple fashion. Also, one or more dopings of the layers can be effected during their deposition. Also included under the term of integrated deposition and/or doping is the procedure of depositing two or more mutually different materials laterally side-by-side on a surface or to produce them laterally side-by-side in a layer region (to be doped).

A principle underlying the invention is not only to insure that the respective materials (preferably gaseous) required for deposition and/or doping are present in contact with a corresponding surface, but also to provide that at least two different-frequency radiations are beamed in. The frequency of the one radiation is selected so it is matched to the reaction characteristic of the one existing material (to be deposited or doped). A second radiation is selected in terms of frequency such that it characteristically acts on the further material destined for deposition or doping, and is present in contact with the surface. An optimum reactive effect given a photolytic process is present when the frequency of the corresponding radiation is selected to be matched to the spectral sensitivity of the respective material that is present. Such interrelationships are fundamentally known. An average person skilled in this art is in a position to select suitable pairings of material and frequency of the radiation to be employed for the teaching of the invention as provided.

The term "light" which has been employed above in conjunction with a "light-induced or photolytic" is not to be understood as restricted to light visible to the human eye. On the contrary, the frequency range for such photo-chemical process of this "light" extends over a frequency range from infrared up to ultraviolet.

As a result of a chronological control of the intensities of at least two different-frequency radiations in the process program for the deposition and/or doping, the radiations are selected suited to the characteristic chemical behavior of the corresponding deposition and/or doping material. A prescribable curve of the deposition and/or doping can thus be induced in the normal direction. For example, an exactly defined layer sequence and/or doping sequence can thus be generated by a correspondingly fast frequency variation of the radiation or a corresponding alternating intensity clocking of two frequency-different radiations. The layer sequence and/or doping sequence has the respectively slight layer thicknesses that are required, for example for a hyperstructure, without further work. Previous attempts have been undertaken to produce such layer sequences with the assistance of molecular beam epitaxy. This is highly involved. Being able to produce such hyperstructures which have long been desired, in a simple fashion, will lead to significant new advances in semiconductor applications.

The method of the invention solves the problem of exactly setting the concentration ratios of the components both for changes in the surface normal directions as well as in the lateral direction. Being able to perform this is important, for example, for semiconductor structures. A deposition of multi-component systems is possible with the invention. The deposition according to the invention of a multi-component system preferably occurs from the vapor phase. Lateral structures are achieved particularly upon application of a light-optical projection mask. Deposition and/or doping from the fluid phase of the corresponding material components is likewise advantageously applicable, and deposition and/or doping from the solid phase of the components is also possible. This will frequently occur given a gaseous intermediate phase.

The substances or components to be deposited are utilized as constituents of gaseous molecule types which have the necessary greatly different energy optical transitions. For example, a two-component system is irradiated with light of the two corresponding resonant frequencies and the two molecule types thus decompose with process rates that correspond the the respective light intensities. Given irradiation of light from two independent, monochromatic sources, for example laser devices, practically any desired material component ratio can thus be set. Given chronological variation of the intensities, even ratios having corresponding gradients or ratio variation can be precisely set.

Within the framework of the invention, the photolytic process can also have a catalytic component, i.e. frequency-selective catalytic processes can also be involved.

A number of particular advnatages of the invention have already been recited above. Particularly avoidable with the invention is a contaminating inclusion of such substances which are necessarily situated in the gas chamber coming into consideration and/or at the inside walls thereof. This is true because the method of the invention is executed at low temperatures or without general heating. Particularly beneficial given the invention is to select the initial molecule type of the materials or components used and which are influenced by light, so that their respective frequency ranges of optimum reaction sensitivity are far removed from one another.

The production of laterally structured layers has already been pointed out above. This is possible with the invention without involved photolithographic processes. Since, however, the intensities of the sources for the radiations coming into consideration can be electrically or electro-optically controlled with high time resolution, results that proceed far beyond those attainable with photo-lithography can be achieved with the invention.

The invention is of great significance particularly for overall semiconductor technology. The invention, however, may also be utilized in the entire technological field of multi-component metal layers.

BRIEF DESCRIPTION OF THE DRAWINGS

FIG. 1 shows an apparatus for the implementation of a method of the invention;

FIG. 2 shows a schematic illustration for layers deposited according to the invention with dopings generated according to the invention; and FIG. 3 shows a simultaneous deposition using two masks.

DESCRIPTION OF THE PREFERRED EMBODIMENTS

FIG. 1 shows an apparatus for the implementation of a method of the invention. Numeral 2 illustrates a substrate of, for example, semiconductor material, that is mounted in a reaction recipient unit 3. Molecules of the various materials provided for deposition and/or doping are available in the inside of this reaction unit and, in particular, above the surface 4 of the substrate 2. They exist there for example, in their gaseous state. The crosses 5 indicate this gas. Numerals 6 and 7 reference a gas inlet and a gas outlet of the reaction unit 3. Lying opposite the surface 4 of the substrate 2, the wall of the reaction unit 3 has a window 8 through which the radiations required for the execution of the method of the invention can pass in optimum absorption-free fashion. Photolytic doping and/or depositing with such gases and a reaction result is well known prior art and will therefore not be discussed in greater detail.

11 and 12 reference a respective source, particularly a laser, for generating two different frequency radiations. A respective control element 15 for the intensity control is situated in each of the respective beam paths 13 and 14 of the lasers 11 and 12. These can, for example, be Pockel cells, well known to those skilled in the art.

It is provided by way of example in FIG. 1 that a structure is produced on the surface 4 of the substrate 2 which has a prescribed shape in a lateral direction, separate from gradients present in a normal direction of the surface 4. In order to realize this lateral design of the structure, a mask 16 known in the prior art and having radiation-transmissive and impermeable planar sections is situated in the beam path 17. For further modulation of the light ray-intensity, such masks can also comprise partially transmitting regions. This mask 16 corresponds to a mask such as is employed for photolithography.

An optical element 18 which unites the radiations 13 and 14 has a semitransparent area area as is known in the prior art. The two radiations 13 and 14 are united into the radiation 17 which impinges the mask 16. Corresponding to the optical reproduction of a diapositive, an imaging of the mask itself occurs on the surface 4 of the substrate 2 with the assistance of a lens 19. Further explanations regarding details of the beam paths are not required because these are sufficiently known from the technology of optical imaging to those skilled in this art.

As already explained, the mask provides a lateral structure to be produced on the surface 4 in the form of an exposure profile formed in lateral directions. This planarly occurring exposure with different intensities in individual surface regions of the surface 4, and to be more precise, the presence of a corresponding intensity distribution in that spatial region of the reaction unit immediately adjacent to the surface 4 and the materials 5 situated in this spatial region, effects the photolytic process. When, for example, the deposition of a layer onto the surface 4 is planned, then a photolytic reaction resulting in a deposition onto the surface 4 occurs on the basis of a frequency-wise matching of the radiation of, for example, the source 11, i.e. of the radiation 13 contained in the radiation 17. This deposition, however, only occurs at those locations at which light intensity of the source 11 is actually present in the region of the surface 4 on the basis of corresponding permeability or on the basis of the imaging of the mask. Due to an insufficient photolytic processing, practically no deposition occurss at dark locations of the image of the mask 16 generated on the surface 4.

The second source 12 whose radiation 14 differs in frequency from the radiation 13 and whose radiation 14 is matched to a second component present in the gas volume 5 effects the deposition of a further layer or a doping process, depending on the task prescribed for the invention. Given a planned doping process which, for example, is to sequence simultaneously with the growth of a layer on the surface 4 which occurs on the basis of the radiation 13, the radiation 14 is beamed in simultaneously with the radiation 13. The intensity of the radiation 14 can thus be controlled, for example with the intensity control element 15 situated in the beam path 14, so that a prescribable gradient of the doping exists in the normal direction of the growing layer.

The deposition of a further layer can also be provided with the assistance of the radiation of the second source 12, for example deposition of a further layer onto a layer previously deposited together with the radiation 13. The respective element 15 in the beam paths 13 and 14 is then operated such that only one of the two radiations 13 and 14 proceeds to the surface 4 and thus effects the deposition onto the surface 4 respectively based on photolysis. By a continuously alternating control of the intensities of the radiations 13 and 14, a periodic structure can be produced.

Alternatively, a uniform layer can be generated on the surface 4 with, for example, the assistance of the radiation 13 upon omission of the mask 16. Given inserted mask 16, a doping structured in a lateral direction of this previously deposited layer can be executed with the assistance of the radiation 14.

When working with a mask, it will be provided in the control case that there is only a single, shared beam path of all radiations impinging the surface 4. When working without a mask, for example in order to generate multilayer structures (without lateral structuring) and, in particular, in order to produce periodic layer sequences, the radiations of two different radiation sources can also be beamed into the spatial region of the reaction unit 3 immediately adjacent to the surface 4 from (mutually different) oblique directions. In this case, too, the chronologically succeeding deposition of various layers is effected by a corresponding chronological control of the radiations to be employed.

For a person skilled in the art, possibilities of variation of depositions and/or dopings lying within the framework of the invention proceed from the above description. This can be accomplished by periodically carrying out the work with or without a mask and/or controlling the various different-frequency radiations to be employed in corresponding isochronological fashion or in corresponding chronological succession.

Analogous to the operating modes described above, radiations from more than two sources can also be provided simultaneously and/or in chronological succession with corresponding deposition procedures and/or doping processes.

FIG. 2 shows a schematic illustration of alternative applications of the invention by a side view of a layer structure on a substrate 2, and at the right sides, a diagram with doping curves.

On the surface 4, two layers 31 and 32 are deposited in accordance with the method of the invention in laterally side-by-side fashion. The radiation inducing the photolytic process has only been allowed to impinge those surface regions of the surface 4 of the substrate 2 which have then been covered by the grown layers 31 and 32. In accordance with the invention, these two layers 31 and 32 may also have been grown simultaneously.

Numerals 33 and 34 indicate two other layers that are laterally positioned side-by-side. The layer 33 is thinner than the layer 34. Although both layers have been grown over the same time span, the layer 33 is thinner than the layer 34 because less light energy was beamed in at the region of layer 33 for photolytic processing than was done at the region of layer 34. Numerals 35 and 36 indicate further layers that have been grown. As shown, the layer 35 has a lesser lateral extent than the layers 31 and 33. This is effected by a corresponding modification of the mask described in FIG. 1.

Possible (exemplary) doping curves for the layers 32, 34, and 36 that can be achieved with the invention without difficulty are shown in a diagram at the right next to the illustrated layer structure. During the growth of the layer 32, that radiation component which is determinant for the photolytic doping process was reduced over the course of time, so that a constant decrease of the doping corresponding to the line curve 132 results in the direction of the thickness of the layer 32. Controlled radiation intensity was applied during the growth of the layer 34 such that a doping curve 134 results during the growth of the layer 34. Numeral 136 indicates a freely selectable doping curve for the layer 36. The dopings corresponding, for example, to 134 and 136, can thus have opposite conductivity types. A corresponding relationship can also exist relative to the doping 132. As may be seen, a very abrupt doping change can be effected with the invention in a simple fashion by changing the frequency of the radiation which controls the photolysis. For completeness, let it be pointed out that the doping junction indicated in FIG. 2 for the boundary surface between the layers 34 and 36 can also lie within the layer 34 or the layer 36, i.e. the transition from one doping to another doping can also be effected during the growth of a uniform layer by a corresponding change of the radiation beamed in. The materials or substances required for the individual depositions and/or for the individual dopings can, for example, have been filled in and are present in the space of the reaction unit 3 from the very beginning, since the respective photolytic deposition process and/or doping operation can be randomly selectively chosen and controlled externally with the selection of the radiation to be carried out.

Examples for the application of the invention are the manufacture of CMOS semiconductor components, power semiconductor components, semiconductor components with SOS technology, and the like. With CMOS elements, the wills provided therein can be provided with a particularly high doped bottom with the invention in a particularly simple fashion. It was previously attempted to reach this goal by implantation doping, whereby on the one hand, a high half-width value could not be avoided and, on the other hand, great radiation damage in the semiconductor material of the will lying thereabove had to be accepted. Given power semiconductor components such as, for example, multi-layer thyristors, the invention is suited for high doping inside deeply disposed layers in an especially easy fashion. Within the framework of SOS technology (silicon on saphire), where "saphire" stands per se for an insulating member such as, for example, quartz, a high doping to be subsequently performed at the boundary surface between the insulator substrate member of, for example, fused quartz, and the semiconductor layer grown thereon, can be effected with the invention. Such a high doping serves to prevent charges at the boundary surface between the insulator and the grown semiconductor layer. Apparatus that can be favorably manufactured with this technology are planar semiconductor displays.

The following examples illustrate the invention.

Example 1

A deposition of two side-by-side layers of Ge and Si is provided. Laser 11 is a $CO_2$-laser with a 10.59 micrometer emission wave length. The mirror 18 is a silicon-disk which is transparent for the emission and which reflects 248 nanometer laser emission from laser 12 which is an Eximer-laser with kryptonfluoride (KRF).

The precursor-gas atmosphere is 40 Torr German (Germaniumtetra-hydride) and 100 Torr silan (Silicon-tetrahydride).

There can be employed one mask 16 for germanium-deposition and one complementary mask 16 for silicon-deposition.

In the case of simultaneous deposition, two complementary masks 161 an 162 must be used as indicated in FIG. 3.

Lenses 191 and 192 and controller means 151, as shown in FIG. 3, may be identical with members 19 and 15 respectively. But it may be advantageous to use lenses and control means with somewhat different characteristics, the respective characteristics being adapted to the substantially different respective wavelengths of each of the two laser emissions.

Example 2

A deposition of Si-layer doped with boron or with phorphorus is employed.

A Si-deposition and apparatus the same as in Example 1 is employed. Atmosphere is silan and 1 torr bortrichloride or phosphortrichloride. Laser 12 is an argonfluoride-laser with 193 nanometer emission. For structured doping, a mask 16 (162) will be used and/or control means 15 (152) controls the intensity 14 for a doping gradient.

Example 3

A deposition of a gallium arsenide-layer is doped with a silicon dopant. The same apparatus as in examples 1 and 2 is employed, but laser 14 may be a laser with 188 nanometer emission. Atmosphere of 0.1 Torr silan, 20 Torr arsin (arsentrihydride), and 1 Torr galliumtrimethyl is employed.

Example 4

A deposition of indiumphosphide-layer is doped with a silicon dopant. The same apparatus as in Examples 1, 2, and 3 is employed, but laser 14 may be a laser with a 260 nanometer emission and an atmosphere with 0.1 Torr silan and indiumtrimethyl-phosphortrimethyl.

Example 5

A deposition of alternating silicon and germanium layers is employed. The same apparatus as in FIG. 1 is employed, for instance with mask 16, and substances like Example 1.

Although various minor changes and modifications might be proposed by those skilled in the art, it will be understood that we wish to include within the claims of the patent warranted hereon all such changes and modifications as reasonably come within our contribution to the art.

We claim as our invention:

1. In a process for light-induced, photolytic or light-induced catalytic deposition or doping of layers or substrates with two different deposition or doping materials which are in contact in liquid or gaseous form with a surface of the substrate or layer, and wherein radiation to be employed for photolysis is directed to said surface, wherein the improvement comprises the steps of:
   controllably depositing said at least two different materials simultaneously during at least a part of the process so that two different layers or dopings occur during the process;
   employing at least two different-frequency radiations during the process, one of the radiations being associated with and independently controlling the depositing of or doping with one of the materials and the other radiation being associated with and independently controlling the depositing of or doping with the other materials;
   independently controlling respective intensities of each of said two radiations in accordance with a desired deposition or doping with the respective two different materials; and
   mixing the at least two different materials present with one another during the process.

2. A process according to claim 1 including the step of stopping at least one of the radiations during the process.

3. A process according to claim 1 wherein simultaneously, with light-induced photolytic deposition, generating one semiconductor layer of a first material and doping it with at least one doping second material to a chronologically randomly selectable doping degree.

4. A process according to claim 1 including the step of successively depositing two or more layers of different materials without chronological interruption of the individual deposition processes.

5. A process according to claim 3 including the step of providing periodically alternating deposition of layers of different material.

6. A process according to claim 4 including the step of additionally doping layers of a first material to be deposited with doping second material simultaneously with their deposition.

7. A process according to claim 1, including the step of executing a simultaneous deposition or doping of different materials which are arranged in lateral side-by-side fashion on a surface of a layer already deposited such that various deposition or doping regions lying lateral in side-by-side fashion are irradiated with respective radiation by masking.

8. In a method for light-induced photolytic layer deposition or layer doping wherein at least two different materials for the layer deposition or layer doping are in contact in gaseous form with either a surface of the layer being doped or upon which a layer deposition is occurring, and wherein radiation to be employed for photolysis is directed to said surface, wherein the improvement comprises the steps of:

simultaneously depositing or doping a plurality of layers by depositing or doping with the two different materials simultaneously during processing so that at least two different layers are deposited or dopings occur simultaneously;

employing at least two different-frequency radiations during the processing of the layers, one of the radiations being associated with and independently controlling the depositing of or doping with one of the materials and the other radiation being associated with and independently controlling the depositing of or doping with the other material.

independently controlling respective intensities of each of the two radiations in accordance with the desired processing of the layers; and providing the at least two different materials in mixed fashion in a reaction chamber during the processing of the layers.

9. In a process for light-induced photolytic or light-induced catalytic deposition of or doping of layers wherein at least two different deposition or doping materials are in contact in liquid or gaseous form with a surface of the layers to be doped or surface upon which a layer deposition is to occur, and wherein radiation to be employed for photolysis is directed to said surface, wherein the improvement comprises the steps of:

simultaneously depositing or doping with at least two different materials during at least a portion of the process so that at least two different layers are deposited or dopings occur simultaneously;

simultaneously employing at least two different-frequency radiations during at least a portion of the process, one of the radiations being associated with and independently controlling the depositing of or doping with one of the materials and the other radiation being associated with and independently controlling the simultaneous depositing of or doping with the other material;

simultaneously independently controlling respective intensities of each of said two radiations in accordance with a desired processing for an integrated deposition of or doping with the respective at least two different materials; and mixing the at least two different materials present with one another during the process.

* * * * *